United States Patent [19]

Kuo et al.

[11] Patent Number: 4,623,482

[45] Date of Patent: Nov. 18, 1986

[54] COPPER CONDUCTIVE PAINT FOR PORCELAINIZED METAL SUBSTRATES

[75] Inventors: Charles C. Y. Kuo, Elkhart; Terry R. Bloom, Middlebury, both of Ind.

[73] Assignee: CTS Corporation, Elkhart, Ind.

[21] Appl. No.: 791,382

[22] Filed: Oct. 25, 1985

[51] Int. Cl.$^4$ ................................................. A01B 1/06
[52] U.S. Cl. .................................... 252/512; 252/518; 106/1.13; 106/1.23; 174/68 A; 428/209; 428/210
[58] Field of Search ............... 252/512, 518; 428/209, 428/210, 432, 433, 469, 689, 697, 702, 901; 174/119 C, 68 A, 138 C; 106/1.12, 1.13, 1.22, 1.23

[56] References Cited

U.S. PATENT DOCUMENTS

| | | | |
|---|---|---|---|
| 2,993,815 | 7/1961 | Treptou | 252/512 |
| 3,293,501 | 12/1966 | Martin | 317/101 |
| 3,776,769 | 12/1973 | Buck et al. | 117/212 |
| 3,827,891 | 8/1974 | Larry | 106/1 |
| 3,902,102 | 8/1975 | Burn | 317/258 |
| 3,935,366 | 1/1976 | Smith | 428/328 |
| 4,072,771 | 2/1978 | Grier | 252/518 |
| 4,084,314 | 4/1978 | Chakrabarty et al. | 29/626 |
| 4,172,919 | 10/1979 | Mitchell | 428/209 |
| 4,322,316 | 3/1982 | Provence et al. | 252/518 |
| 4,323,483 | 4/1982 | Rellick | 106/1.13 |
| 4,354,311 | 10/1982 | Neuhoff et al. | 29/840 |
| 4,414,143 | 11/1983 | Felter | 252/518 |
| 4,446,059 | 5/1984 | Eustice | 428/433 |
| 4,503,090 | 3/1985 | Brown et al. | 252/518 |
| 4,514,321 | 4/1985 | Suita | 106/1.13 |
| 4,521,329 | 6/1985 | Suita | 252/518 |

*Primary Examiner*—Josephine L. Barr
*Attorney, Agent, or Firm*—Rodger H. Flagg

[57] ABSTRACT

A copper conductive paint for use on a porcelanized metal substrate, which comprises a powder mixture of 82 to 98.5% copper, 0.5 to 12% copper hydroxide, and 1 to 6% non-reducable borosilicate glass frit. 75 to 90 percent of the powder mixture is blended with 10 to 25 percent screening agent to form the copper conductive paint herein disclosed. The copper conductive paint is then screened and fired upon a porcelainized metal substrate in an inert atmosphere at approximately 900° C. to form a copper conductor exhibiting improved adhesion characteristics.

20 Claims, 3 Drawing Figures

COPPER CONDUCTIVE PAINT FOR PORCELAINIZED METAL SUBSTRATES

TECHNICAL FIELD

The present invention relates to copper conductive paints, for screening and firing upon a high temperature porcelainized metal substrate. More specifically, this invention relates to copper conductive paint comprising 82 to 98.5% copper (Cu); 0.5 to 12% copper hydroxide (Cu(OH)$_2$); and 1 to 6% non-reducable borosilicate glass frit.

BACKGROUND ART

Copper conductive paint has been used in combination with precious metals for many years. Reference is made to the following U.S. Pat. Nos. 3,293,501; 3,776,769; 3,827,891; 3,935,366; 4,084,314 and 4,354,311, as being representative of this art.

The combined use of copper and copper oxide in the form of CuO or Cu$_2$O is disclosed in U.S. Pat. Nos. 4,072,771; 4,172,919; 4,323,483; and 4,521,329. U.S. Pat. Nos. 3,902,102 discloses a copper conductive paste disposed upon a ceramic substrate.

A paper presented by co-applicant, Dr. Kuo, to the International Society of Hybrid Microelectronics (ISHM) in 1981, entitled "Adhesion of Thick Film Copper Conductors," relating to alumina substrates, provides useful background data. Also a paper presented by Naomichi Suzuki et al. to the ISHM in 1984, entitled "Application of Porcelain Steel Substrate Thick Film Conductors in Japan" discloses the advantages of a porcelain steel substrate over printed circuit boards (PCB) or epoxy steel substrates. The above referenced patents and publications comprise the closest known prior art.

DISCLOSURE OF THE INVENTION

Table I provides a comparison of the color, density and chemical structure of copper (Cu); copper oxide (CuO and Cu$_2$O); and copper hydroxide (Cu(OH)$_2$).

TABLE I

| Material | Color | Density | Structure |
| --- | --- | --- | --- |
| Cu | Red | 8.9 | Cubic |
| CuO | Black | 6.3 | Cubic (monoclinic) |
| Cu$_2$O | Red | 6.0 | Cubic (octagonal) |
| Cu(OH)$_2$ | Blue | 3.4 | Amorphous |

The inherent differences in the compositions noted in Table I, effect the performance of a copper conductive paint made therefrom, particularly in relation to firing temperatures, resistivity, adhesion and aging characteristics.

Low temperature porcelain metal substrates typically employ an amorphous, or non-crystalline product of fusion which has a typical softening point of 650° C., which limits the firing temperature of paints to 600° to 650° C.

The low firing temperature of conventional porcelain enamel substrates limits the kind of applicable thick film paints that may b used. Some copper conductive paints require higher firing temperatures to adequately sinter the copper conductor. High quality thick film materials typically require high temperature firing. Devitrified or crystalline porcelainized material is preferably used on high temperature porcelainized metal substrates.

The surface characteristics between alumina and porcelain metal substrates are different. Alumina is much more inert, whereas porcelainized metal substrates are more chemically reactive.

Low temperature lead oxide glass frit and high content bismuth trioxide glass frit used with alumina substrates are not suitable for high temperature porcelainized metal substrates. The lead oxide and bismuth trioxide react with the porcelain at high temperatures, reducing these compositions to metal, with a resultant loss of adhesion characteristics.

High temperature porcelainized metal substrates are desirable because they provide a low coefficient of expansion and improved thermal conductivity. These characteristics are particularly useful for surface mounted devices.

One difficulty of applying a copper conductor to a high temperature porcelainized steel substrate is adhesion. Yet another is aging.

Early efforts to improve adhesion of copper in high temperature porcelainized metal substrates include the use of precious metals in the copper conductor composition. Precious metals are expensive, which greatly increases the cost of products using them.

The present invention provides a copper conductive paint useful for firing upon a high temperature porcelainized metal substrate, such as a porcelainized steel substrate, or a copper clad invar material made by Texas Instruments. The addition of copper hydroxide (Cu(OH)$_2$) to the copper powder (Cu) improves the adhesion and aging characteristics of the conductive paint for use upon a high temperature porcelainized metal substrate. The glass frit used with the copper and copper hydroxide preferably has a thermal expansion closely aligned with the thermal expansion of the porcelainized metal substrate, such as a non-reducable Ba-Ca borosilicate glass frit.

The above mentioned and other features of this invention and the manner of attaining them will be best understood by reference to the following description of an embodiment of the invention, when considered in conjunction with the accompanying drawings.

BEST MODE FOR CARRYING OUT THE INVENTION

Figure 1:
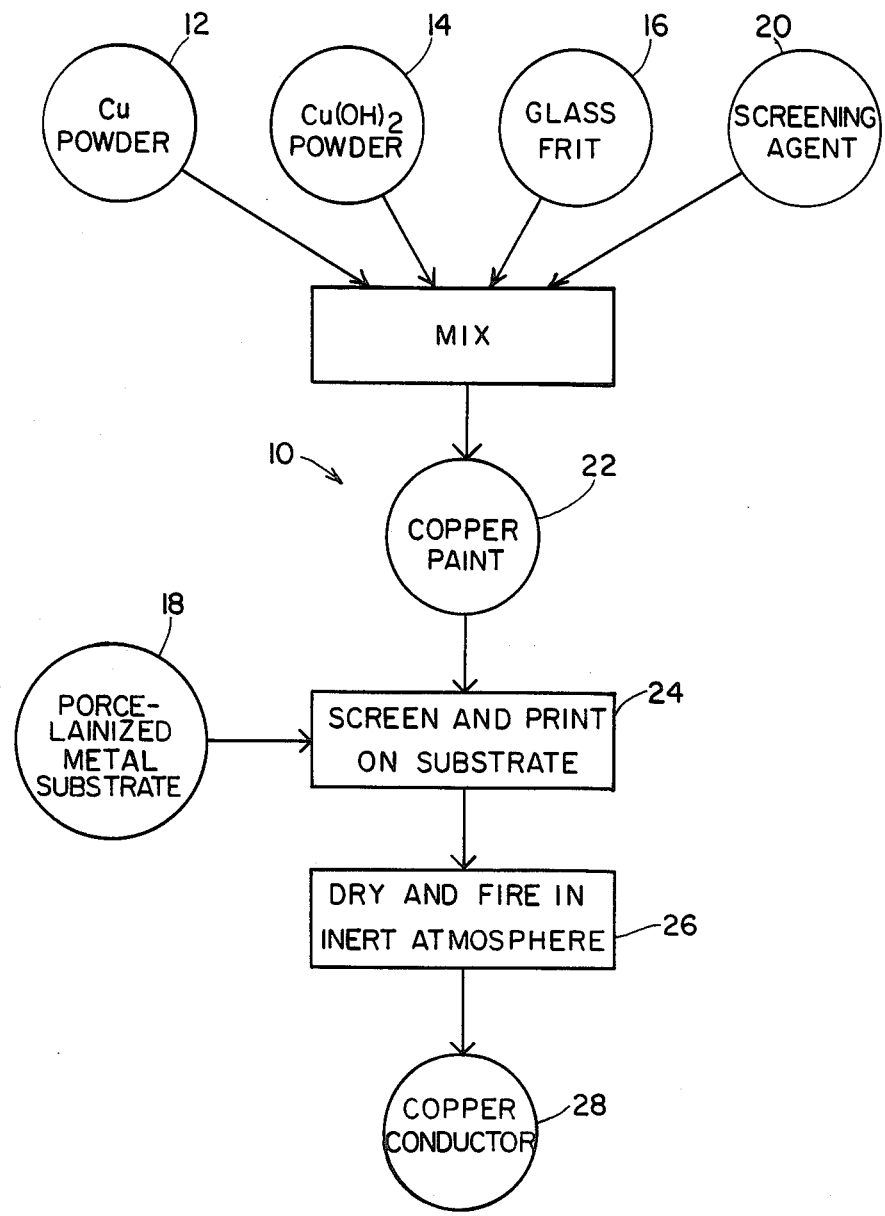
FIG. 1 is a flow diagram of the preferred composition and processing steps of the present invention.

The subject matter which we regard as our invention is particularly pointed out and distinctly claimed in the claims. The structure and operation of our invention, together with further features and advantages, may be better understood from the following description given in conjunction with the accompanying drawings, in which:

FIG. 1 is a flow diagram of the preferred composition and processing steps of the present invention. The copper conductive thick film paint 10 is blended with 82 to 98.5% copper 12 (Cu), 0.5 to 12% copper hydroxide 14 (Cu(OH)$_2$), and 1 to 6% glass frit 16 suitable for use with a high temperature porcelainized metal substrate 18, such as a non-reducable borosilicate glass frit. For purposes of this disclosure, the term "non-reducable" is used to identify glass frit that is substantially non-reducable at approximately 900° C. in an inert atmosphere, in accordance with such use in thick film technology. The preferred glass frit 16 comprises 50 to 54% BaO, 10 to 14% CaO, 14 to 18% $B_2O_3$ and 18 to 22% $SiO_2$. Reducable glass frits, such as frits having lead oxide, bismuth trioxide or cadium oxide in sufficient quantity to adversely affect the adhesion characteristics of the copper conductor paint 10 to the porcelainized metal substrate, are not desired.

All compositions disclosed herein are given by weight percentage.

The copper (Cu) powder, copper hydroxide (Cu(OH)$_2$), and the glass frit are each preferably ground to a particle size of less than 10 microns prior to mixing.

The copper conductive powder mixture disclosed herein is blended with a screening agent 20 to form a high temperature copper conductive paint 22 exhibiting improved adhesion and aging characteristics. The preferred ratio is: 75 to 90 percent copper conductive powder mixture to 10 to 25 percent screening agent.

The screening agent 20 is preferably a solvent, such as pine oil, terpinel, an ester alcohol of Texanol from Texas Eastman Co., butyl carbitol acetate, or the like. Resins may be used for binders in the screening agent, which are preferably polyalkyl methacrylate from DuPont or Rohm and Hass, or polybutenes, such as Amoco H-25, Amoco H-50 or Amoco L-100 from Amoco Chemicals Corporation. A wetting agent is sometimes added to the screening agent to aid in wetting the conductive powder for improved paint rheology.

The copper conductive paint 22 is screened and printed upon a porcelainized metal substrate 18 to form a desired configuration thereon. The conductive paint is preferably screened through a 200 mesh stainless steel screen with 0.5 mil emulsion.

The screened porcelanized metal substrate 24 is preferably dried at 100° to 125° C. in air for about 15 minutes, prior to firing. After drying, the screened metal substrate 18 is preferably fired 26 in a belt furnace at approximately 900° C. peak temperature for approximately 3 to 30 minutes in an inert atmosphere. The preferred inert atmosphere is a nitrogen atmosphere, having an oxygen content of less than 15 ppm.

The porcelainized metal copper conductor 28 disclosed herein may be subsequently screened with a resistive paint, and refired, to form additional circuitry thereon.

Traditionally, high temperature copper conductive paints are used in conjunction with alumina substrates. Due to the difficulties associated with adhesion and aging, high temperature copper conductive paints have not been satisfactorily employed upon porcelainized metal substrates, such as porcelainized steel substrates, or copper clad invar supplied by Texas Instruments.

High temperature porcelainized metal substrates have several advantages over PCB or alumina substrates, which include superior strength, formability, thermal conductivity, magnetic potential, improved reluctance, and improved reflow soldering.

The advantages of using a copper conductor, rather than a precious metal conductor, such as silver, include at least in part: less cost, high conductivity, low migration and low solder leaching. The high conductivity of silver is reduced by the inclusion of other elements, which combine with the silver to raise the resistivity of precious metal conductive paint made therefrom.

The 1984 paper presented to ISHM entitled "Application of Porcelain Steel Substrate Thick Film Circuits in Japan" compares copper conductors on PCB and epoxy steel substrates with silver thick film conductors on high temperature porcelainized steel substrates. Reference Table 2 on page 110 of this document, which is incorporated by reference herein.

Silver thick film conductors are being used with porcelainized metal substrates in the art because a copper conductor composition for use on high temperature porcelainized metal substrates is not commercially available. Copper conductors are often preferred over silver conductors on PCB and alumina substrate applications.

A high temperature porcelainized steel substrate called "FUJIMETAX" supplied by Fujikura of Japan, and referenced in Table I of the "Application of Porcelain Steel Substrate Thick Film Circuits in Japan" was coated and fired with a commercially available copper conductive paint #9922 supplied by DuPont. The average peel test showed a $2\pm\frac{1}{2}$ lb. peel was required to separate a lead from the copper conductor. A four pound minimum peel is preferred for most commercial applications. On an alumina substrate, the peel test of DuPont's conductive paint #9922 showed that greater than a 5 pound peel was required to separate a lead from a copper conductor. This example emphasizes the different results obtained with an identical paint on alumina and procelainized metal substrates.

Tests with the copper conductor paint disclosed herein on "FUJIMETAX" high temperature porcelainized steel substrate of the type previously disclosed are listed in Tables II, III and IV below.

Table II comprises examples 1-3, showing the effect of the preferred non-reducable borosilicate glass frit upon the peel strength of a copper conductive paint.

In examples 1 to 3, the combination of copper and borosilicate glass frit did not raise the peel strength above 2.7 lbs.

TABLE II

|  | Cu | Glass Frit | Peel Test (ave.) |
|---|---|---|---|
| Example 1 | 98% | 2% | 2.1# |
| Example 2 | 96% | 4% | 2.7# |
| Example 3 | 94% | 6% | 0.6# |

All peel test examples in Tables II, III and IV are the average results of 12 test samples. The peel test comprised an 80 mil. square metallization pad dip soldered in a 60/40 tin/lead solder at 225° C. Twenty gauge tinned copper wire was then soldered accross the 80 mil. metallization pads and adhesion measured by peeling the wire at 90° to the metallization pad. The force required to cause separation of the conductor pad from the substrate; or the force at which the wire peeled out of the solder, while the copper metallization remained attached to the substrate, was used to determine the peel test data.

As shown in Table III, Examples 4-8, 1 to 6% of a non-reducable borosilicate glass frit comprising 52% BaO; 12% CaO; 16% $B_2O_3$; and 20% $SiO_2$; was blended with a controlled amount (6%) of Cu(OH)$_2$ and 88 to 93% copper (Cu) to form the powdered mixtures tested.

86% of the powdered mixture was subsequently blended with 14% of the screening agent to form the copper conductive paint. After drying, the copper conductive paint was screened and fired at approximately 900° C. in an inert atmosphere upon a porcelainized steel substrate to form Examples 4–8. The copper conductor thus formed was then peel tested as previously disclosed, to obtain the results disclosed in Table III and shown graphically in FIG. 3.

TABLE III

|  | Cu | Cu(OH)₂ | Glass Frit | Peel Test (ave.) |
|---|---|---|---|---|
| Example 4 | 93% | 6% | 1% | 2.8 lb. |
| Example 5 | 92% | 6% | 2% | 6.1 lb. |
| Example 6 | 91% | 6% | 3% | 6.7 lb. |
| Example 7 | 89% | 6% | 5% | 7.0 lb. |
| Example 8 | 88% | 6% | 6% | 1.6 lb. |

Figure 3:
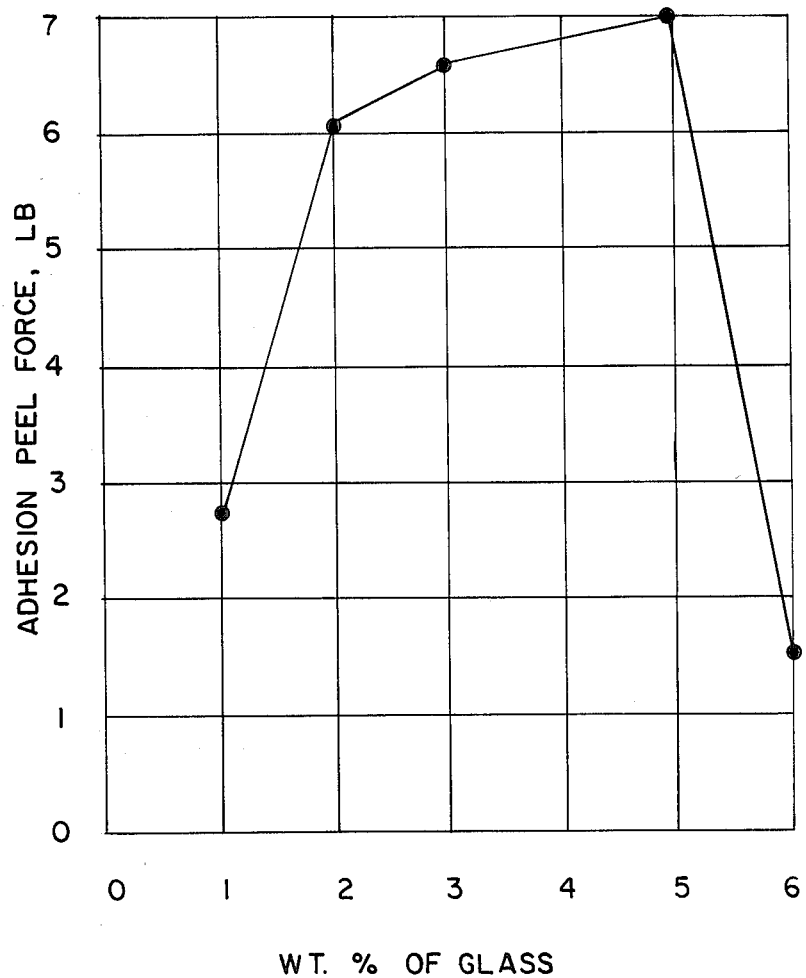
FIG. 3 is a graph showing the effect of glass on adhesion when used in a copper conductive thick film paint of the present invention on a procelainized metal substrate.

As noted in Examples 5 through 7 in Table III and FIG. 3, more than 1% and less than 6% borosilicate glass frit is preferred, when used with 6% Cu(OH)₂.

Figure 2:
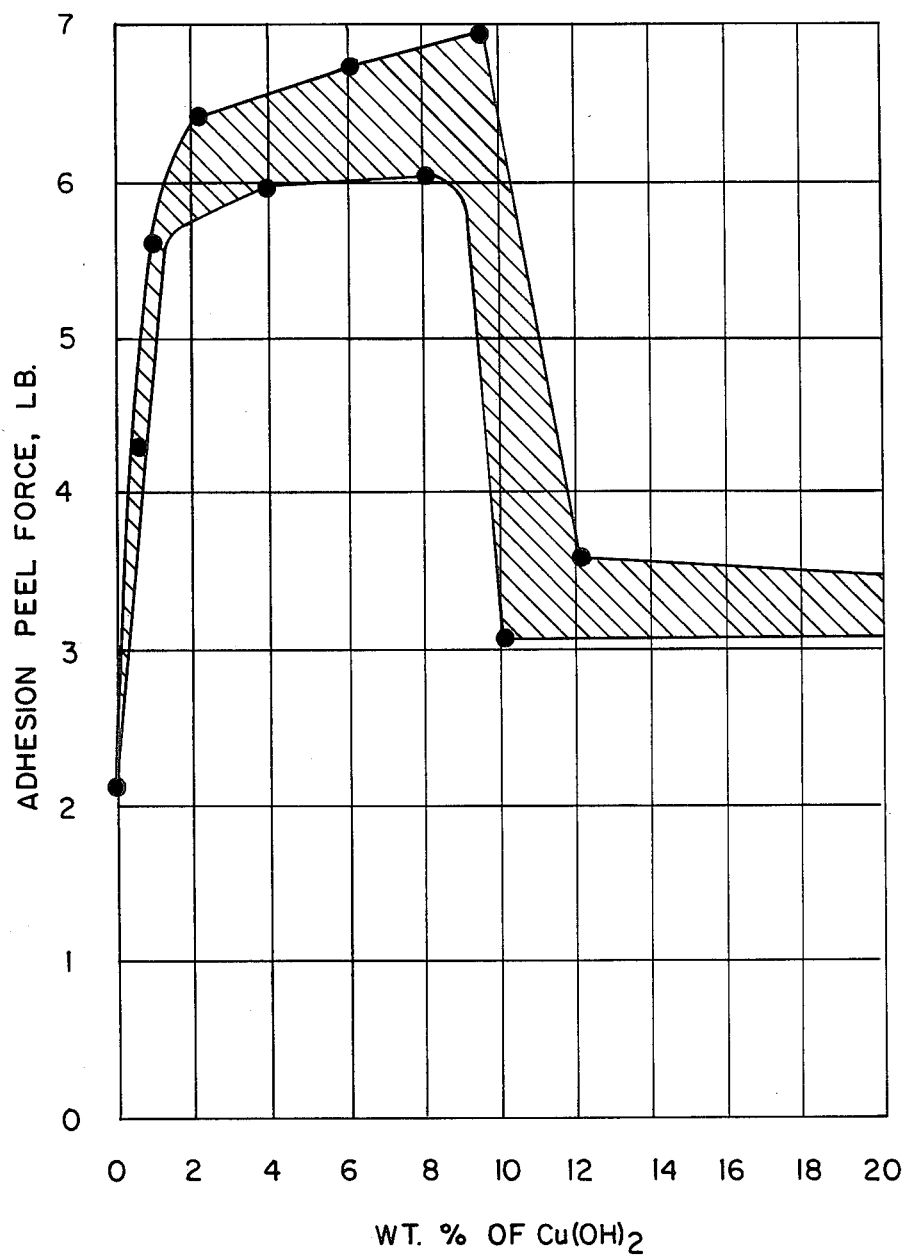
FIG. 2 is a graph showing the effect of Cu(OH)$_2$ on adhesion when used in a copper conductive thick film paint on a porcelainized metal substrate.

As shown in Table IV, Examples 9 through 19, varying amounts of Cu(OH)₂ were combined with a controlled amount (4%) of the borosilicate glass frit used in Examples 4 through 8, and 76 to 96% copper (Cu) to form the powdered mixture tested. 86% of the powered mixture was blended with 14% of the screening agent to form a copper conductive paint. This paint was first dried, then screened and fired at approximately 900° C. in an inert atmosphere upon a porcelainized steel substrate to obtain the results disclosed in Table IV, examples 9 through 19, and graphically shown in FIG. 2.

From this data, it can be seen that a four pound or greater peel test may be obtained using from 0.5 to 10% Cu(HO)₂. Beyond 10% Cu(HO)₂, the conductive powder composition is stabilized at approximately 3.1 to 3.6 peel test, which is less than preferred.

TABLE IV

|  | Cu | Cu(OH)₂ | Glass Frit | Peel Test (ave.) |
|---|---|---|---|---|
| Example 9 | 96% | 0% | 4% | 2.1# |
| Example 10 | 95.5% | 0.5% | 4% | 4.3# |
| Example 11 | 95% | .1% | 4% | 5.6# |
| Example 12 | 94% | 2% | 4% | 6.4# |
| Example 13 | 92% | 4% | 4% | 5.8# |
| Example 14 | 90% | 6% | 4% | 6.7# |
| Example 15 | 88% | 8% | 4% | 6.0# |
| Example 16 | 87% | 9% | 4% | 6.9# |
| Example 17 | 86% | 10% | 4% | 3.1# |
| Example 18 | 84% | 12% | 4% | 3.6# |
| Example 19 | 76% | 20% | 4% | 3.5# |

The improved adhesion characteristics of the preferred copper conductive paint to a porcelainized metal substrate is made evident from the peel tests disclosed in examples 10 through 16.

From the data disclosed in Tables II, III and IV, it is believed that a four pound or greater peel test is obtainable by varying proportions of the porcelainized mixture which comprises from 0.5 to 12% (Cu(OH)₂, non-reducable borosilicate glass frit from 1 to 6%, and Cu from 82 to 98.5% for blending with a screening agent and subsequent screening and firing onto a porcelainized metal substrate.

The use of Cu(OH)₂ in the conductive paint disclosed herein reduces copper oxide sputtering onto nearby porcelain, which is a common problem with copper and copper oxide paints. Further, when more than 6% copper oxide is mixed with copper to form a conductive paint, a dark red stain may form on the porcelainized metal surface, which adversely effects the appearance, quality and performance of the circuits. This stain is not apparent when copper and Cu(OH)₂ are blended to form the preferred conductive paint disclosed herein. The improved appearance of the copper conductor disclosed herein is attributable to the use of Cu(OH)₂, (which is amorphous), rather than copper oxide, (which is cubic in structure), when used on porcelainized steel substrates.

Therefore, while this invention has been described with reference to a particular embodiment, it is to be understood that modifications may be made without departing from the spirit of the invention, or from the scope of the following claims.

INDUSTRIAL APPLICABILITY

This invention discloses a copper conductive paint adapted for firing upon a high temperature porcelainized steel substrate, to form a copper conductive pattern thereon, for use in electronic circuitry.

We claim:

1. A thick film copper conductive paint suitable for firing upon a high temperature porcelainized metal substrate, which comprises:
   a copper conductive powder mixture with 82 to 98.5 percent copper powder, 0.5 to 12 percent copper hydroxide, and 1 to 6 percent non-reducible borosilicate glass frit, wherein 75 to 90 percent of the powder mixture is blended with 10 to 25 percent screening agent to form the copper conductive paint.

2. The copper conductive paint of claim 1, wherein the copper conductive paint is subsequently screened upon the high temperature porcelainized metal substrate and fired in an inert atmosphere at approximately 900° C.

3. The copper conductive paint of claim 1, wherein the copper powder, the copper hydroxide and the glass frit are each ground to a particle size of less than 10 microns prior to mixing.

4. The copper conductive paint of claim 1, wherein the non-reducible borosilicate glass frit comprises: 50 to 54 percent BaO, 10 to 14 percent CaO, 14 to 18 percent B₂O₃ and 18 to 22 percent SiO₂.

5. The copper conductive paint of claim 1, wherein the porcelainized metal substrate is a porcelainized steel substrate.

6. The copper conductive paint of claim 1, wherein the porcelainized metal substrate is a copper clad substrate.

7. The copper conductive paint of claim 1, wherein the glass frit is selected to ensure that the thermal coefficient of expansion of the glass frit is closely aligned with the thermal coefficient of expansion of the metal substrate.

8. The copper conductive paint of claim 1, wherein the screening agent forms no carbon residue when pyrolitically decomposed in an inert atmosphere.

9. A thick film base metal copper conductive paint for screening and firing upon a porcelainized metal substrate, which comprises:
   a mixture of 82 to 98.5 percent Cu powder, from 0.5% to 12% Cu(OH)₂ and from 1 to 6% non-reducible borosilicate glass frit; the mixture blended with a screening agent to form the copper conductive paint therefrom.

10. The copper conductive paint of claim 9, wherein the Cu(OH)$_2$ comprises from 1 to 10 percent of the mixture prior to blending.

11. The copper conductive paint of claim 9, wherein the non-reducible borosilicate glass frit comprises 2 to 5 percent of the mixture prior to blending.

12. The copper conductive paint of claim 9, wherein the borosilicate glass frit comprises 50 to 54 percent BaO, 10 to 14 percent CaO, 14 to 18 percent B$_2$O$_3$ and 18 to 22 percent SiO$_2$.

13. The copper conductive paint of claim 9, wherein 75 to 90 percent of the mixed conductive powder is blended with 10 to 25 percent screening agent to blend the copper conductive paint therefrom.

14. The copper conductive paint of claim 9, wherein the copper powder, the copper hydroxide and the glass frit are each ground to a particle size of less than 10 microns prior to mixing.

15. The copper conductive paint of claim 9, wherein the screening agent forms no carbon residue when pyrolitically decomposed in an inert atmosphere.

16. The copper conductive paint of claim 9, wherein the glass frit is selected to ensure that the thermal coefficient of expansion of the glass frit is closely aligned with the thermal coefficient of expansion of the metal substrate.

17. A thick film base metal copper conductor, which comprises:
(a) a high temperature porcelainized metal substrate;
(b) a copper conductive paint blended from a screening agent and a powder mixture, the powder mixture comprising 82 to 98.5 percent copper powder, from 0.5% to 12 percent copper hydroxide, and from 1 to 6 percent non-reducible borosilicate glass frit;
(c) a means to screen the copper conductive paint in a conductive pattern upon the high temperature porcelainized metal substrate; and
(d) a means to fire the screened substrate in an inert atmosphere at a temperature of approximately 900° C.

18. The copper conductor of claim 17, wherein the non-reducible borosilicate glass frit comprises: 50 to 54 percent BaO; 10 to 14 percent CaO; 14 to 18 percent B$_2$O$_3$; and 18 to 22 percent SiO$_2$.

19. The copper conductor of claim 17 wherein 75 to 90 percent of the powder mixture is blended with 10 to 25 percent screening agent to blend the copper conductive paint therefrom.

20. The copper conductor of claim 17, wherein the thermal coefficient of expansion of the borosiliate glass frit is selected to closely align with the thermal coefficient of expansion of the metal substrate.

* * * * *